United States Patent
Hung et al.

(10) Patent No.: US 8,038,897 B2
(45) Date of Patent: Oct. 18, 2011

(54) METHOD AND SYSTEM FOR WAFER INSPECTION

(75) Inventors: Chang-Cheng Hung, Jhubei (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1290 days.

(21) Appl. No.: 11/671,772

(22) Filed: Feb. 6, 2007

(65) Prior Publication Data

US 2008/0187842 A1    Aug. 7, 2008

(51) Int. Cl.
*G01R 31/00* (2006.01)

(52) U.S. Cl. .......... 216/59; 216/37; 324/216; 324/76.11

(58) Field of Classification Search .......... 216/37, 216/59; 324/718, 755, 764
See application file for complete search history.

(56) References Cited

U.S. PATENT DOCUMENTS

| | | | | |
|---|---|---|---|---|
| 5,118,957 A | * | 6/1992 | Kawashima et al. | 250/559.4 |
| 5,787,190 A | * | 7/1998 | Peng et al. | 382/145 |
| 6,268,740 B1 | * | 7/2001 | Iida | 324/765 |
| 6,426,168 B1 | * | 7/2002 | Johnson | 430/30 |
| 6,846,597 B2 | * | 1/2005 | Narukawa et al. | 430/5 |
| 7,359,545 B2 | * | 4/2008 | Dixon et al. | 382/145 |
| 2004/0146295 A1 | * | 7/2004 | Furman et al. | 398/9 |

FOREIGN PATENT DOCUMENTS

CN    ZL00108792.4    6/2000
JP    61137050 A    6/1986

OTHER PUBLICATIONS

A.C. Engelsberg et al. IEEE/CPM Int'l Electronics Manufacturing Technology Symposium, (1996) pp. 223-231.*
M.A. Taubenblatt et al. Applied Optics, vol. 31, (1992), pp. 3354-3362.*
Chinese Office Action for Application No. 2007101376680, dated Aug. 28, 2009, 6 pages.

* cited by examiner

*Primary Examiner* — Nadine G Norton
*Assistant Examiner* — Maki A Angadi
(74) *Attorney, Agent, or Firm* — Haynes and Boone, LLP

(57) ABSTRACT

A method for inspecting semiconductor wafers patterned by a photomask includes loading a first wafer and scanning a first image of the first wafer, loading a second wafer and scanning a second image of the second wafer, comparing the first and second images, and classifying a difference detected between the first and second images as a potential defect on the photomask. The potential defect includes a haze defect on the photomask.

13 Claims, 6 Drawing Sheets

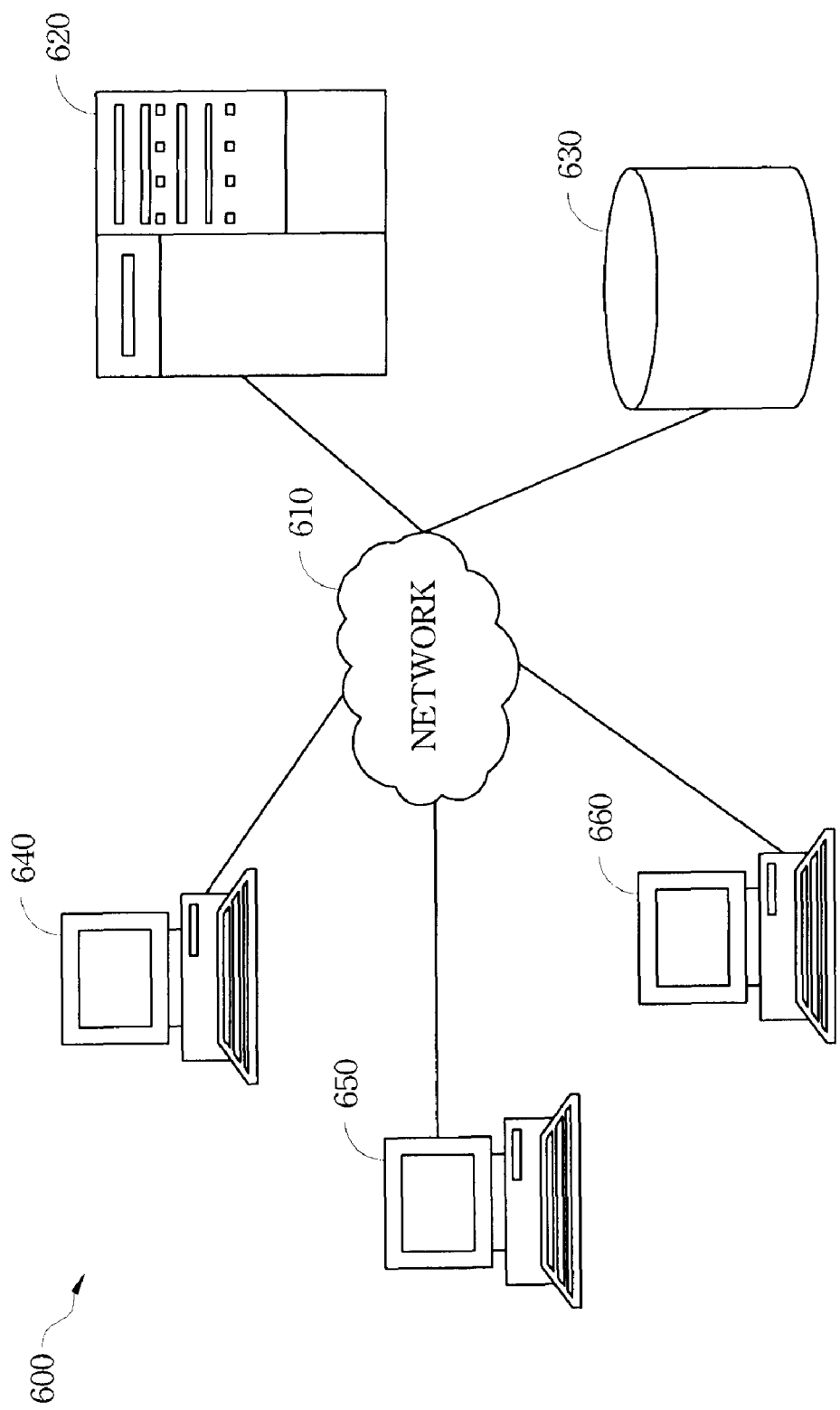

METHOD AND SYSTEM FOR WAFER INSPECTION

BACKGROUND

The present disclosure relates in general to semiconductor manufacturing technology, and more particularly, to inspecting defects on semiconductor wafers associated with photomask precipitates.

Photomasks (sometimes called reticles) are commonly used for photolithography in semiconductor manufacturing. Photomasks are typically made from very flat pieces of quartz or glass with a layer of patterned material (e.g., chromium) deposited on a side. The patterned material is used to transfer an image to a substrate such as a semiconductor wafer. The patterned material can be selected or arranged to form a BIM (Binary Mask), a PSM (Phase Shift Mask), or combinations thereof, to effectively pattern a projected amount of radiation being exposed during photolithography. While contamination of photomasks has always been a problem, high precision masks, such as are used in photolithography having wavelengths equal to or less than 248 nm, are particularly susceptible to defects. One type of photomask contamination is referred to as haze contamination. Haze contamination is a precipitant formed from mask cleaning chemical residual or impurity of fab or tool environment cross exposure. For example, when a solution including ammonium ($NH_4$) and sulfate ($SO_4$) is used to clean a photomask, contamination becomes apparent when the photomask is exposed to a short wavelength UV light, such as 248 or 193 nm. However, periodically inspecting or re-qualifying photomasks is costly and time consuming.

Therefore, what is needed is a simple and cost-effective method and system for inspecting semiconductor wafers to classify defects on a photomask.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 6 is a computing environment for implementing the method of FIG. 2.

DETAILED DESCRIPTION

Figure 1:
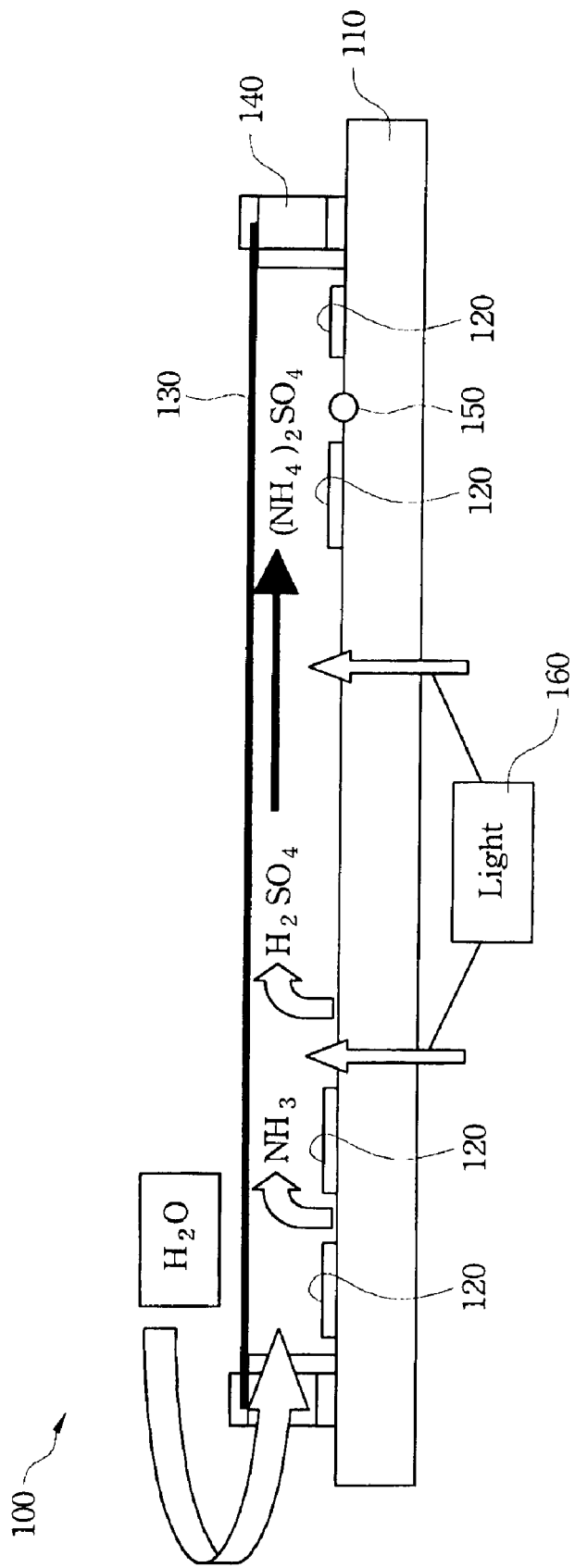
FIG. 1 is a cross sectional view of a photomask having precipitates such as haze contamination.

It is to be understood that the following disclosure provides different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

Now referring to FIG. 1, illustrated is a photomask 100 having a precipitate such as haze contamination. In semiconductor manufacture, the photomask 100 is employed in photolithography for transferring an image of a circuit pattern onto a semiconductor wafer. The photomask 100 may include a transparent substrate 110 having fused quartz (SiO), calcium fluoride ($CaF_2$), or other suitable material. The photomask 100 may further include an absorption layer 120 formed on the transparent substrate 110 (of the circuit pattern), using chromium (Cr), iron oxide, or an inorganic film made with MoSi, ZrSiO, SiN, $MoSiON_x$, and/or TiN. The absorption layer 120 may have a multilayer configuration. For example, the absorption layer 120 may include an anti-reflective coating (ARC) layer.

The photomask 100 may further include a pellicle having a transparent membrane 130 and frame 140 for protecting the photomask from damage and contamination. It is very important for the photomask 100 to be clean and free of any contamination that may have been generated from the fab environment, photomask handling/storage, photomask fabrication, photomask pod out-gassing, pellicle frame residue, pellicle glue, or other semiconductor manufacture process. If there is any type of contamination on the photomask 100, it can cause defects when patterning the semiconductor wafer. Accordingly, the photomask 100 may undergo several cleaning and rinsing steps before and after photolithography.

The photomask 100 may typically be cleaned with a mixture of sulfuric acid ($H_2SO_4$) and hydrogen peroxide ($H_2O_2$) (commonly known as sulfuric peroxide mix (SPM)). The SPM clean may be used to remove organic particles or native oxides on the photomask 100. Additionally, the photomask 100 may be cleaned with a mixture of ammonium hydroxide ($NH_4OH$) and hydrogen peroxide ($H_2O_2$) (commonly known as an SC-1 or APM cleaning solution). The SC-1 clean may be used to remove inorganic particles on the photomask 100. Furthermore, the photomask 100 may undergo a cold and/or hot rinse with de-ionized water ($H_2O$) throughout the cleaning steps.

However, when the photomask 100 is cleaned with a solution based on chemicals such as sulfate (from SPM clean) and ammonium (from SC-1 clean), residual ions such as sulfate ions ($SO_4^{2-}$) and ammonium ions ($NH_4^+$) may be generated and may combine in a high energy environment to form a precipitate 150 such as $(NH_4)_2SO_4$ on the photomask 100.

It has been observed that sulfate and ammonium precipitates are the root causes that lead to crystal growth and haze contamination. Additionally, as the photomask 100 is continuously used in the photolithography process, energy from a light source 160 may accelerate the growth of these precipitated defects. For example, with a UV light source of 248 or 193 nm wavelength, precipitated defects can grow and/or deposit upon or near the photomask 100. These precipitated defects will limit the usage of the photomask 100. Furthermore, these defects are unpredictable and may be large enough to result in printable defects on the semiconductor wafer during photolithography and thus, cause wafer yield loss.

Accordingly, semiconductor fabs must periodically inspect photomasks for defects, referred to as photomask re-qualification. However, there are many disadvantages associated with this process such as limited capacity of a mask shop, limited capability of inspection tools as feature sizes continue to decrease, required cycle time for re-qualification, risk of contamination during transportation of the photomask between the fab and mask shop, and costs/resources for re-qualification.

Figure 2:
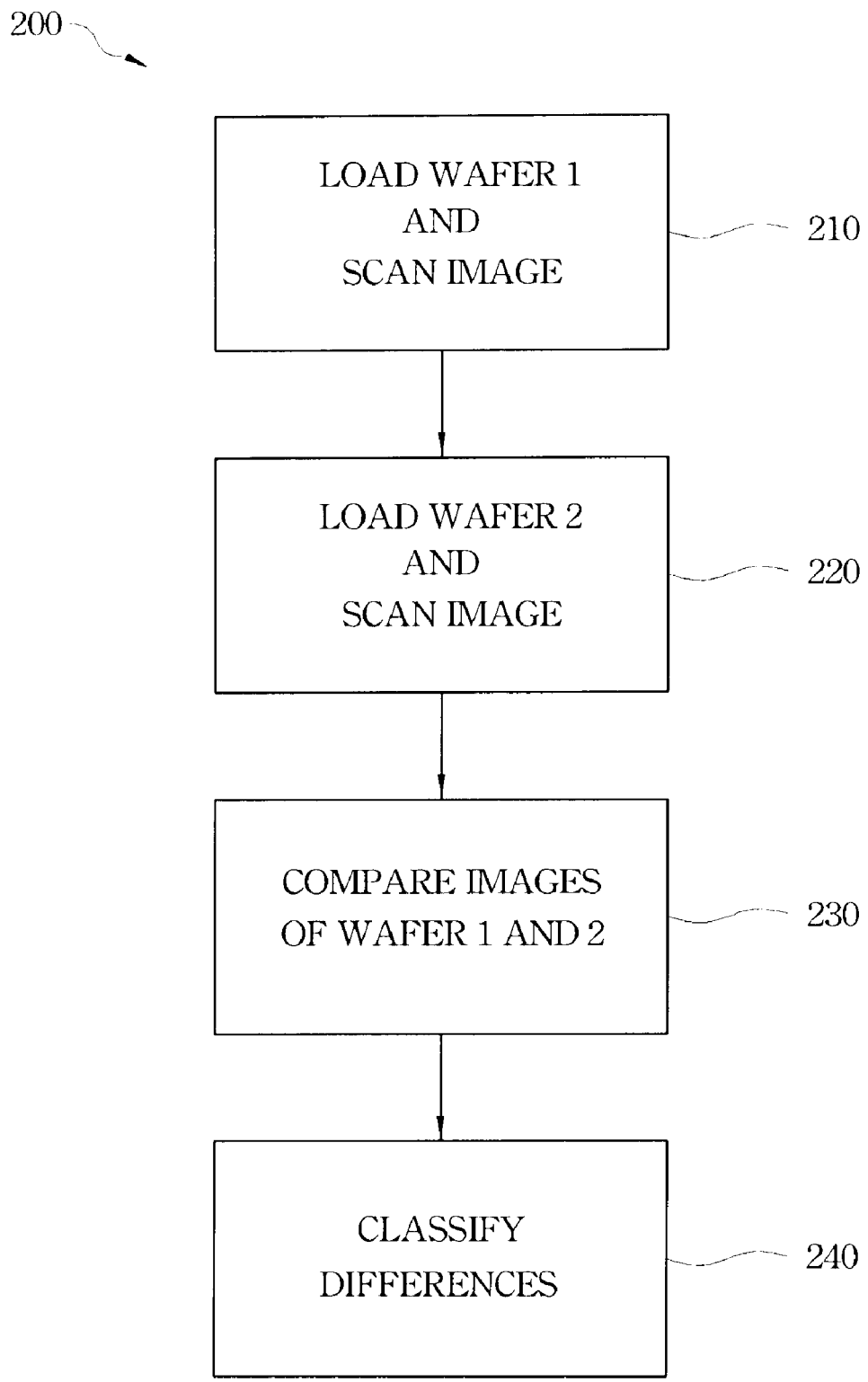
FIG. 2 is a flow chart for a method of inspecting semiconductor wafers to classify defects on a photomask according to one embodiment of the present disclosure.

Now referring to FIG. 2, illustrated is a flow chart for a method 200 of inspecting semiconductor wafers to classify defects on a photomask. The method 200 may be implemented following photolithography of two semiconductor wafers using the same photomask. It is understood that photolithography process to pattern a semiconductor wafer is known in the art and thus, is not described in detail here. The method 200 begins in step 210 in which a first wafer may be loaded into a scanning system to scan an image of the first wafer. Various wafer scanning systems may be used such as scanning electron microscope (SEM) system, optical microscope system, scanning probe microscope system, laser microscope system, transmission electron microscope system, focus ion beam microscope system, or other suitable optical imaging systems. In the present embodiment, the first wafer may comprise of a pattern that was printed with a defect-free photomask. For example, the first wafer may be patterned with a photomask that has recently been inspected and cleaned at a mask shop and determined to be substantially free of defects. The first wafer may be referred to as a reference wafer (also referred to as a golden wafer). Accordingly, the scanned image of this first wafer may be referred to as a reference image and may be generated in an electronic format and stored in memory.

The method 200 continues with step 220 in which a second wafer may be loaded into the scanning system to scan an image of the second wafer. The second wafer may also be patterned with the same photomask that was used to pattern the first wafer. In the present embodiment, the second wafer may represent any subsequent semiconductor wafer that has been patterned with the same photomask. For example, the second wafer may represent the $50^{th}$ or $100^{th}$ or $200^{th}$ or $300^{th}$, etc. semiconductor wafer that has been exposed and patterned with the same photomask. The second wafer may be referred to as a current wafer. Accordingly, the scanned image of the second wafer may be referred to as a current image and may also be generated in an electronic format and stored in memory.

The scanning system for scanning the images of the first and second wafer may comprise of a dual or multiple objective lens system. The multiple objective lens system may include a first objective lens for scanning the image of the first wafer and a second objective lens for scanning the image of the second wafer. The scanning system grabs images scanned by the first and second objective lens simultaneously. Alternatively, the scanning system may optionally comprise of a single objective lens system. In this system, the single objective lens may be used to scan an image of the first wafer and then be used to scan an image of the second wafer. Accordingly, the images of the first and second wafers are scanned sequentially. Alternatively, the scanning system may implement two scanners each having a single objective lens system. It is understood that the lens systems described herein are mere examples, and that other types of lens systems may be used that generate high resolution images of patterned-wafers.

The method 200 continues with step 230 in which the images of the first and second wafer may be compared. The comparison may be performed by a application program. The image of the first wafer or the reference image may be in an electronic format. Additionally, the image of the second wafer or the current image may also be in an electronic format. For the sake of example, the reference image and the current image may be formatted in an array of pixels, where each pixel represents a specific location of the image and includes an intensity value. For example, the intensity value may increase as the brightness of the pixel increases. The number of pixels in the array may vary and may depend on a resolution capability of the scanning system. The application program may use an algorithm that goes through the array of pixels of both the reference image and the current image and compares the corresponding intensity values of each pixel. Accordingly, the entire first and second wafers are compared to each other. It is understood that other types of values may be used to represent each pixel such as a color value (e.g., red component value, green component value, and blue component value).

The method 200 continues with step 240 in which a difference between the reference image and current image may be classified and reported as a potential defect on the photomask. As discussed above, for each pixel (at the same location) of the reference image and the current image, their corresponding intensity values may be compared. If the values differ by a pre-determined amount, the pixel and its location may be marked to identify the difference. If the values do not differ by the pre-determined amount, the pixel and its location may not be marked. The application program may classify and report the identified difference as a potential defect on the photomask. Since the reference image represents a patterned-wafer (e.g., golden wafer) that was substantially free of defects, the difference detected in the current image (with respect to the reference image) may indicate a defect in the pattern printed on the current wafer, and thus, a potential defect on the photomask may be present. It is understood that the pre-determined amount may vary and may be determined by the type of scanning system that is used. Additionally, the pre-determined value may be provided by the fab using its experience in recognizing and identifying these types of defects on photomasks.

The potentially defective photomask may be disqualified and sent to the mask shop for inspection. Additionally, the application program may also report the location of the identified difference to the mask shop so that the photomask can be efficiently inspected, cleaned, and/or re-worked if necessary. Thus, by closely monitoring and comparing an image of the most recent patterned-wafer to the reference image, defects on the photomask may be detected early in the wafer process before they cause yield loss. Furthermore, the costs and/or time expended in periodically inspecting photomasks may be greatly reduced.

Figure 3:
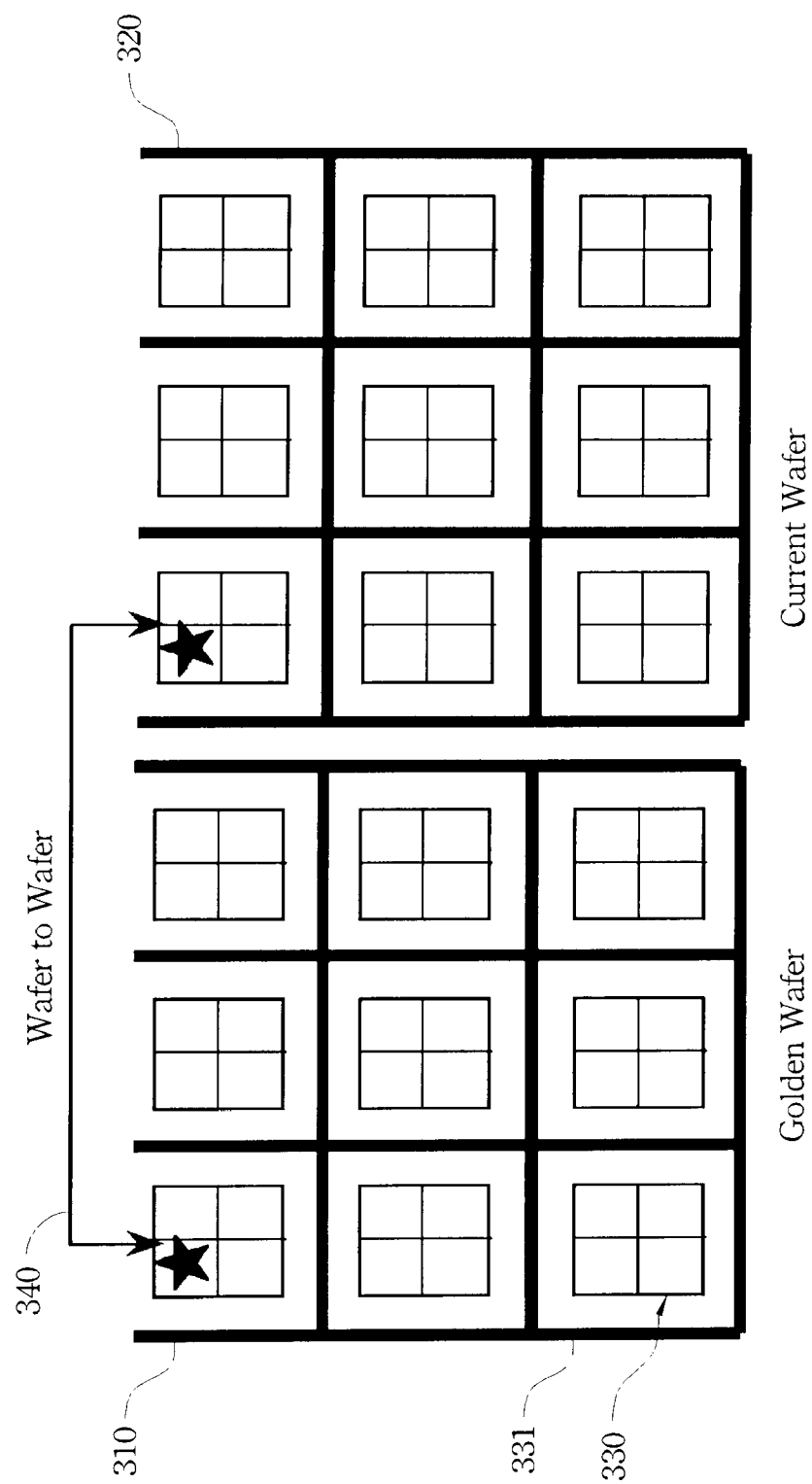
FIG. 3 is an example of two semiconductor wafers patterned with a same photomask.

Now referring also to FIG. 3, illustrated are two semiconductor wafers that have been patterned with a same photomask. A first wafer may be referred to as a golden wafer 310 and a second wafer may be referred to as a current wafer 320. The golden wafer 310 and the current wafer 320 have been patterned with the same photomask and thus, have a same pattern printed on both wafers. For example, both wafers 310, 320 may be patterned by a stepper during photolithography. The stepper may transfer a multiple-die layout 330 onto the wafer 310, 320 during a single exposure (referred to as one shot) 331. The stepper then moves on to a next location on the wafer 310, 320 and repeats the exposure step to transfer the multiple-die layout 330 to the next location. The stepper follows this process until the entire wafer is patterned. It is understood that other types configurations may be used such as a single-die layout and/or other types of photolithography equipment may be used. In the present embodiment, the printed layout of the golden wafer 310 may be compared with the printed layout of the current wafer 320, that is, a wafer to wafer comparison 340 may be performed.

Figure 4:
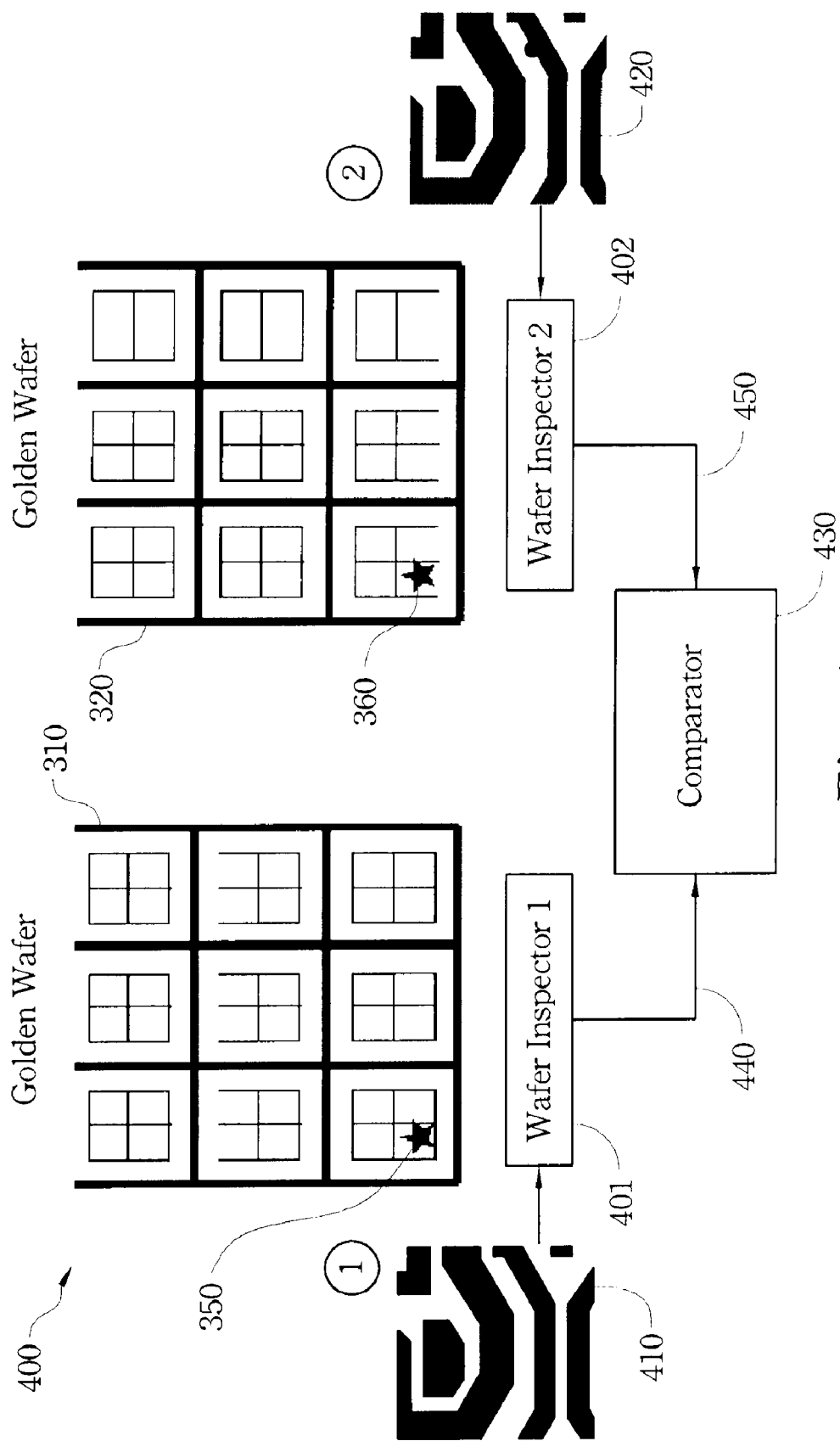
FIGS. 4 and 5 are diagrams of a system for inspecting semiconductor wafers to classify defects on a photomask according to one embodiment of the present disclosure.
Figure 5:
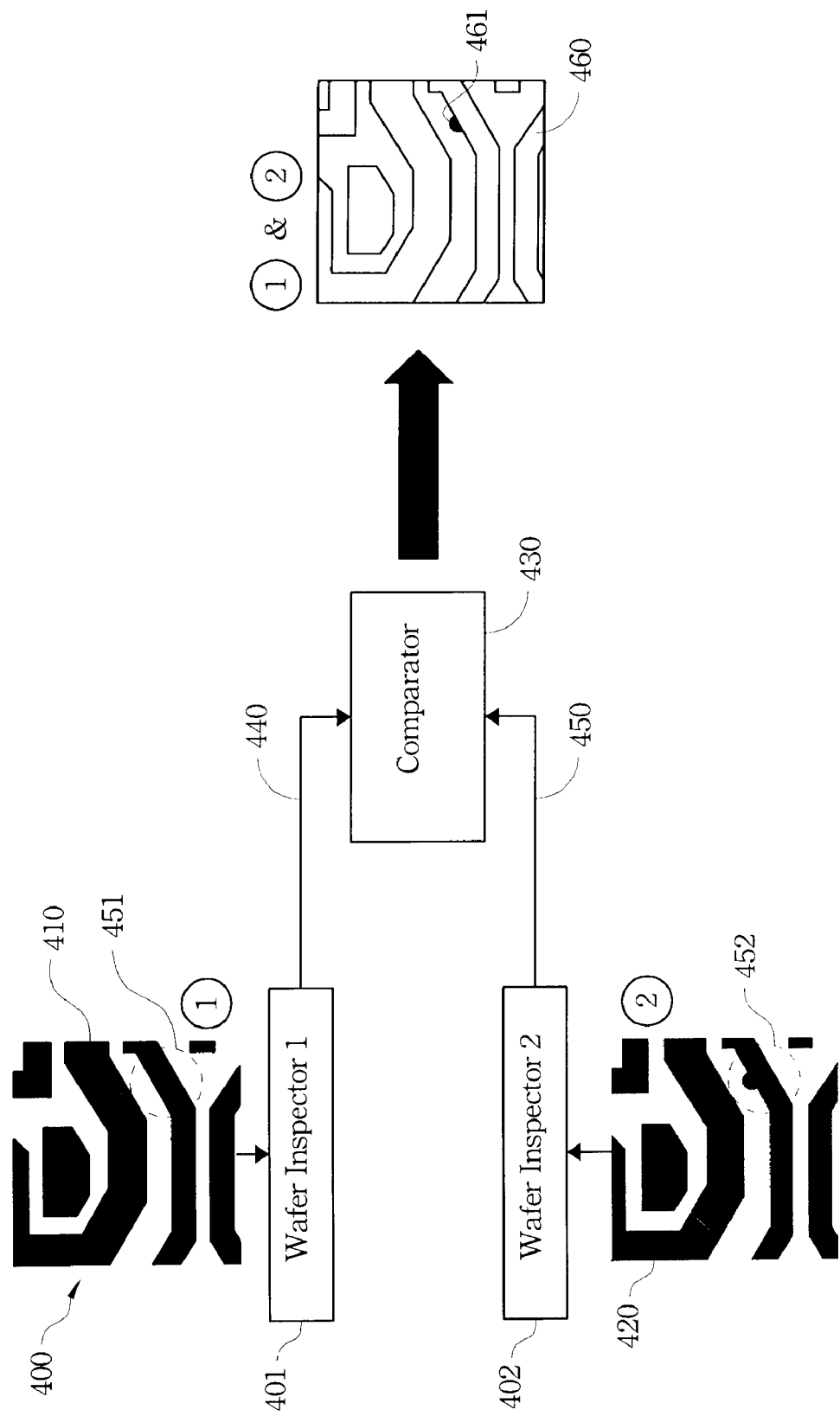

Now referring to FIGS. 4 and 5, illustrated are diagrams of a system 400 for implementing the method 200 of FIG. 2. For the sake of example, the system 400 may compare a portion 350 of the golden wafer 310 with a portion 360 of the current wafer 320 (at the same location) before moving on to a next portion of the wafers. The system 400 continues with this process until the entire golden wafer 310 has been compared with the entire current wafer 320. The golden wafer 310 may be loaded to a first wafer inspector 401 and the current wafer 320 may be loaded to a second wafer inspector 402. The first and second wafer inspectors 401, 402 may each comprise of a wafer defect inspection tool such as an optical or electron beam imaging system. The first and second wafer inspectors 401, 402 may operate as a stand alone station and independent from each other. Even though only two wafer inspectors are disclosed herein, it is understood that any number of wafer inspectors may be implemented in the system 400 and may depend on a size and configuration of the semiconductor fab.

The first wafer inspector 401 may scan the portion 350 of the golden wafer 310 and generates an image 410. The second wafer inspector 402 may scan the portion 360 of the current wafer 320 and generates an image 420. The system 400 may further comprise a comparator 430. The comparator 430 includes software and hardware that is necessary for running an application program to compare the images 410, 420. For example, the comparator 430 may include a computer or processor that may be coupled to the first and second wafer inspectors 401, 402 by a data bus 440, 450. The images 410, 420 may be generated in an electronic format and may be transferred via the data bus 440, 450 to the comparator 430. The comparator 430 may input the images 410, 420 to the application program where an algorithm compares the images to detect a difference between the images.

In the this example, there is an area 451, 452 of the images 410, 420 that are different from each other. Accordingly, the algorithm will compare 460 the images 410, 420 to detect a difference 461 as was previously described. The comparator 460 may classify and report the difference 461 as a potential defect on the photomask. The comparator 460 may further report a location on the photomask that corresponds to the location of the detected difference. The photomask may be disqualified and may then be sent to the mask shop for inspecting, cleaning, and/or re-working.

It is understood that the image 410 of the golden wafer 310 may be stored as a reference for comparing with any subsequent patterned-wafer using the same photomask. Furthermore, the image 410 of the golden wafer 310 may be captured at several different stages following exposure by photolithography. The various stages include, but are not limited to, after development inspection (ADI), after etching inspection (AEI), and after stripping inspection (ASI). For the sake of example, an image of a patterned-wafer may be captured and used as a reference image after developing the exposed photoresist or after etching the wafer using the developed photoresist as mask or after stripping the developed photoresist from the wafer.

Even though the method 200 of FIG. 2 has been disclosed to detect potential defects on photomask, such as haze contamination, it is understood that the method may also be used as a flexible monitoring tool to evaluate changes and/or modifications in other semiconductor processes. For example, a photomask may modified to implement an optical proximity correction (OPC) modification that compensates for non-ideal properties of photolithography. An image of a patterned-wafer using the original photomask may already be stored in memory as a reference image as previously discussed. An image of a patterned-wafer using the modified photomask may be generated. The images may be compared for a side-effect evaluation of the OPC modification with respect to the original.

Additionally, changes and/or modifications with processing equipment may be evaluated using this method 200. For example, an image of a patterned-wafer implementing lithography system A (e.g., stepper A) may be compared with an image of a patterned-wafer implementing lithography system B (e.g., stepper B). Accordingly, an evaluation of a difference between the images may determine which system is better suited for this type of application. Furthermore, changes and/or modifications with semiconductor processes may be evaluated using this method 200. For example, an image of a patterned-wafer implementing etching recipe C may be compared with an image of a patterned-wafer implementing an experimental etching recipe D. Again, an evaluation of a difference between the images may determine which etching recipe is better suited for this type of application.

Now referring to FIG. 6, illustrated is a computing environment 600 that may be used to implement the method 200 of FIG. 2 according to one embodiment of the present disclosure. The computing environment 600 may comprise of a network 610, which provides a medium through which various devices and computers in the computing environment can communicate. The network 610 may include connections such as wires, wireless, and/or fiber optic cables. The network 610 may further the Internet and/or a collection of networks and gateways that use such things as a Transmission Control Protocol/Internet Protocol (TCP/IP) or other suitable protocols to communicate with. In another example, the network 610 may include a number of different types of networks such as a local area network (LAN), or a wide area network (WAN).

The computing environment 600 may comprise of a server 620, a storage unit 630, and a plurality of clients 640, 650, 660. The plurality of clients 640, 650, 660 may include workstations, personal computers, or other suitable devices. The server 620 may provide applications and/or data stored in the storage unit 630 to the clients 640, 650, 660. Furthermore, the computing environment 600 may comprise of additional nodes, such as additional servers, clients, and other devices not shown herein. FIG. 6 is intended to be a mere example, and not as an architectural limitation for the present disclosure.

In a more specific example, the method 200 of FIG. 2 and system 400 of FIG. 4 may be implemented within the computing environment 600. The clients 640, 650, 660 may be associated with the wafer inspectors and the comparator as was described in FIG. 4. The server 620 may provide the required data and/or software applications to the clients 640, 650, 660 to implement the method 200 of FIG. 200. The server 620 may also retrieve and store defect data generated by the comparator as well as image data generated by the wafer inspectors. Additionally, other clients such as a mask shop may communicate via the network 610 to receive defect data so that the mask shop can efficiently inspect and clean the photomask.

Thus, the present disclosure provides a method for inspecting semiconductor wafers patterned by a photomask. The method comprises loading a first wafer and scanning an image of the first wafer, loading a second wafer and scanning an image of the second wafer, comparing the images of the first and second wafer, and classifying a difference detected in the image of the second wafer with respect to the image of the first wafer as a potential defect on the photomask. In some embodiments, the first wafer is patterned with the photomask that was inspected to be substantially free of defects. The second wafer is patterned with the same photomask at a time after patterning of the first wafer.

In other embodiments, the loading and scanning the first and second wafers are performed in an optical imaging system. In other embodiments, the loading and scanning the first and second wafers are performed after a developing inspection of the first and second wafers. In other embodiments, the loading and scanning the first and second wafers are performed after an etching inspection of the first and second wafers. In still other embodiments, the loading and scanning the first and second wafers are performed after a stripping inspection of the first and second wafers. In some embodiments, the method further comprises disqualifying the photomask and sending the photomask for inspection. In other embodiments, the comparing includes running an algorithm to detect the difference between the first and second images. In still other embodiments, the classifying includes classifying the difference as a haze defect on the photomask.

The present disclosure also provides a system for inspecting semiconductor wafers. The system comprises a first wafer inspector for generating an image of a first wafer, a second wafer inspector for generating an image of a second wafer, and a comparator coupled to the first and second wafer inspectors via a data bus. The comparator is configured and operable to receive the images of the first and second wafer via the data bus, compare the images of the first and second wafer, and classify a difference detected in the image of the second wafer with respect to the image of the first wafer resulting from the comparison.

In some embodiments, the first and second wafer inspectors include a stand alone wafer defect inspection tool. The wafer defect inspection tool includes an optical imaging system. In other embodiments, the optical imaging system includes a single objective lens system. In still other embodiments, the optical imaging system includes a multiple objective lens system.

The present disclosure provides, in another embodiment, a method comprising patterning a first wafer and a second wafer, generating an image of the patterned first wafer and an image of the patterned second wafer, comparing the images of the first and second wafer, and classifying a difference detected in the image of the second wafer with respect to the image of the first wafer resulting from the comparing step. In some embodiments, the patterning includes patterning the first wafer a first process and patterning the second wafer with a second process. The classifying the difference includes evaluating the first process and the second process to determine which process is better suited for the patterning step. In other embodiments, the classifying the difference includes identifying a haze defect on a photomask that was used to pattern the first and second wafers. The method further comprises inspecting and cleaning the photomask.

Although embodiments of the present disclosure have been described in detail, those skilled in the art should understand that they can make various changes, substitutions, and alterations herein without departing from the spirit and scope of the present disclosure. For example, various processing steps of the described methods may be executed in a different order or executed sequentially, combined, further divided, replaced with alternate steps, or removed entirely. Furthermore, various functions illustrated in the methods or described elsewhere in the disclosure may be combined to provide additional and/or alternate functions. Accordingly, all such modifications are intended to be included within the scope of this disclosure.

Several different advantages exist from these and other embodiments. In addition to providing an efficient and cost-effective method and system for inspecting defects on semiconductor wafers, the method and system disclosed herein can be easily integrated with current semiconductor processing equipment and can detect defects on photomask before they become yield-limiting. By closely monitoring defects on semiconductor wafers instead of relying on inspecting photomask for defects, the costs and time associated with re-qualifying, transporting, and re-working photomasks are greatly reduced. Additionally, the risk of further contamination as the photomasks are transported between the fab and the mask shop is greatly reduced. The method and system can also be implemented to monitor and evaluate wafer deviation associated with other semiconductor processes such as optical proximity correction (OPC) modification side-effect evaluation or lithography tool/process changes.

What is claimed is:

1. A method for inspecting semiconductor wafers patterned by a photomask, the method comprising:
   loading a first wafer and scanning a first image on the first wafer;
   loading a second wafer and scanning a second image on the second wafer;
   comparing the first and second images to detect a difference between the first and second images to determine whether a potential defect exists on the photomask; and
   classifying the difference detected between the first and second images as a potential defect on the photomask only if the difference detected between the first and second images is equal to or greater than a predetermined value.

2. The method of claim 1, wherein the first wafer is patterned with the photomask that was inspected to be substantially free of defects.

3. The method of claim 2, wherein the second wafer is patterned with the same photomask at a time after patterning of the first wafer.

4. The method of claim 1, wherein the loading and scanning the first and second wafers are performed by an optical imaging system.

5. The method of claim 1, wherein the loading and scanning the first and second wafers are performed after a developing inspection of the first and second wafers.

6. The method of claim 1, wherein the loading and scanning the first and second wafers are performed after an etching inspection of the first and second wafers.

7. The method of claim 1, wherein the loading and scanning the first and second wafers are performed after a stripping inspection of the first and second wafers.

8. The method of claim 1, further comprising:
   disqualifying the photomask; and
   sending the photomask for inspection.

9. The method of claim 1, wherein the comparing includes running an algorithm to detect the difference between the first and second images.

10. The method of claim 1, wherein the classifying includes classifying the difference as a haze defect on the photomask.

11. A method comprising:
    scanning a first image on a first semiconductor wafer, the first image being produced by a photomask;
    scanning a second image on a second semiconductor wafer, the second image being produced by the photomask;
    comparing the first and second images to detect a difference between the first and second images to determine whether a potential defect exists on the photomask; and identifying a difference between the first and second images as a defect on the photomask only if the difference detected between the first and second images is equal to or greater than a predetermined value.

12. The method of claim 11 further comprising:
providing the defect and the photomask for inspection.

13. The method of claim 12 further comprising:
determining a location of the difference; and
providing the determined location with the photomask for inspection.

* * * * *